United States Patent
Takemura

(10) Patent No.: US 9,431,400 B2
(45) Date of Patent: Aug. 30, 2016

(54) SEMICONDUCTOR MEMORY DEVICE AND METHOD FOR MANUFACTURING THE SAME

(75) Inventor: Yasuhiko Takemura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/359,529

(22) Filed: Jan. 27, 2012

(65) Prior Publication Data
US 2012/0199842 A1 Aug. 9, 2012

(30) Foreign Application Priority Data

Feb. 8, 2011 (JP) ................................ 2011-024686

(51) Int. Cl.
*H01L 27/108* (2006.01)
*H01L 29/786* (2006.01)
(Continued)

(52) U.S. Cl.
CPC ........... *H01L 27/108* (2013.01); *G11C 11/405* (2013.01); *H01L 21/84* (2013.01);
(Continued)

(58) Field of Classification Search
CPC ............. H01L 27/108; H01L 27/0629; H01L 27/10876; H01L 27/10885; H01L 27/10823; H01L 27/10814; H01L 27/10808; H01L 27/10847; H01L 27/10852; H01L 28/40; H01L 29/12; H01L 29/786; H01L 29/4236; H01L 23/5223; H01L 21/44
USPC .................... 257/296, 302, 328–330, 43, 76, 257/202–212, 297, 300, 306, 347; 438/666
See application file for complete search history.

(56) References Cited

U.S. PATENT DOCUMENTS 4,777,625 A 10/1988 Sakui et al.
4,922,453 A 5/1990 Hidaka
(Continued)

FOREIGN PATENT DOCUMENTS

EP 1737044 A 12/2006
EP 1965428 A 9/2008
(Continued)

OTHER PUBLICATIONS

Han et al., Band gap shift in the indium-tin-oxide films on polyethylene napthalate after thermal annealing in air, 2006, Journal of Applied Physics 100, 083715-5.*

(Continued)

*Primary Examiner* — Julia Slutsker
*Assistant Examiner* — Natalia Gondarenko
(74) *Attorney, Agent, or Firm* — Eric J. Robinson; Robinson Intellectual Property Law Office, P.C.

(57) ABSTRACT

A highly integrated DRAM is provided. A bit line is formed over a first insulator, a second insulator is formed over the bit line, third insulators which are in a stripe shape and the like are formed over the second insulator, and a semiconductor region and a gate insulator are formed to cover one of the third insulators. The bit line is connected to the semiconductor region through first contact plugs. Then, a conductive film is formed and subjected to anisotropic etching to form word lines at side surfaces of the third insulators, and a second contact plug is formed to be connected to a capacitor at a top of the one of the third insulators. By synchronizing the word lines, electric charge is accumulated or released through the capacitor. With such a structure, the area of a memory cell can be $4F^2$.

13 Claims, 9 Drawing Sheets

(51) Int. Cl.
  *G11C 11/405* (2006.01)
  *H01L 21/84* (2006.01)
  *H01L 27/12* (2006.01)
  *H01L 21/44* (2006.01)
  *H01L 29/12* (2006.01)
  *H01L 27/02* (2006.01)

(52) U.S. Cl.
  CPC ... *H01L27/10894* (2013.01); *H01L 27/10897* (2013.01); *H01L 27/1207* (2013.01); *H01L 27/0207* (2013.01); *H01L 27/10814* (2013.01); *H01L 27/10852* (2013.01); *H01L 27/10876* (2013.01); *H01L 27/10885* (2013.01); *H01L 27/1203* (2013.01)

(56) References Cited

U.S. PATENT DOCUMENTS

| | | |
|---|---|---|
| 5,302,843 A | 4/1994 | Yamazaki |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al |
| 7,262,089 B2 | 8/2007 | Abbott et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,453,103 B2 | 11/2008 | Abbott et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,586,130 B2 * | 9/2009 | Kawashima et al. ........ 257/135 |
| 7,601,984 B2 | 10/2009 | Sano et al. |
| 7,674,650 B2 | 3/2010 | Akimoto et al. |
| 7,732,819 B2 | 6/2010 | Akimoto et al. |
| 7,888,207 B2 | 2/2011 | Wager, III et al. |
| 8,338,827 B2 | 12/2012 | Yamazaki et al. |
| 8,716,061 B2 | 5/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0047785 A1 * | 3/2003 | Kawasaki et al. ............ 257/350 |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0206996 A1 * | 10/2004 | Lee et al. ..................... 257/296 |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0081884 A1 * | 4/2006 | Abbott et al. ................. 257/208 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125025 A1 | 6/2006 | Kawashima et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042193 A1 * | 2/2008 | Osabe et al. .................. 257/325 |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001436 A1 | 1/2009 | Kondo |
| 2009/0068773 A1 | 3/2009 | Lai et al. |
| 2009/0072291 A1 * | 3/2009 | Takaishi ...................... 257/306 |
| 2009/0073325 A1 | 3/2009 | Kuwabara et al. |
| 2009/0085098 A1 * | 4/2009 | Oyu .............................. 257/327 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0207649 A1 | 8/2009 | Tang et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0200851 A1 * | 8/2010 | Oikawa et al. ................. 257/43 |

FOREIGN PATENT DOCUMENTS

| | | |
|---|---|---|
| EP | 2184783 A | 5/2010 |
| EP | 2226847 A | 9/2010 |
| JP | 60-198861 A | 10/1985 |
| JP | 63-188890 A | 8/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-296378 A | 12/1988 |
| JP | 05-029573 A | 2/1993 |
| JP | 05-075059 A | 3/1993 |
| JP | 05-251705 A | 9/1993 |
| JP | 06-334146 A | 12/1994 |
| JP | 08-264794 A | 10/1996 |

(56) References Cited

FOREIGN PATENT DOCUMENTS

| JP | 11-505377 | | 5/1999 |
|---|---|---|---|
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2002-319682 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-502597 | | 1/2006 |
| JP | 2007-528609 | | 10/2007 |
| JP | 2009-071247 | A | 4/2009 |
| JP | 2010-135774 | A | 6/2010 |
| WO | WO-2004/038757 | | 5/2004 |
| WO | WO-2004/114391 | | 12/2004 |
| WO | WO-2005/093836 | | 10/2005 |
| WO | WO-2006/038504 | | 4/2006 |

OTHER PUBLICATIONS

Fan et al., Zinc Oxide Nanostructures: Synthesis and Properties, 2005, J. Nanosci. Nanotech. 2005, vol. 5, No. 10, pp. 1561-1573.*
Hiroshi, machine translation of JPH0575059 (A), 1993, pp. 1-11.*
Takashii, machine translation of JPH06334146 (A), 1994, pp. 1-12.*
Kim.K, "Technology for sub-50nm DRAM and NAND Flash Manufacturing,", IEDM 05: Technical Digest of International Electron Devices Meeting, Dec. 5, 2005, pp. 333-336.
Fortunato.E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Ikeda.T et al., "Full-Functional System Liquid Crystal Display Using CG-Silicon Technology," SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors," Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor," IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Prins.M et al., "A Ferroelectric Transparent Thin-Film Transistor," Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.," Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panei Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al.,"Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-107204-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317 , ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Taiwanese Office Action (Application No. 101103785) Dated Feb. 17, 2016.

* cited by examiner

SEMICONDUCTOR MEMORY DEVICE AND METHOD FOR MANUFACTURING THE SAME

BACKGROUND OF THE INVENTION

1. Field of the Invention

The present invention relates to a semiconductor memory device.

2. Description of the Related Art

A dynamic random access memory (DRAM) including one capacitor and one transistor (referred to as a cell transistor) has been widely used as a typical semiconductor memory device. A planar transistor has been conventionally used to form a DRAM; however, in accordance with miniaturization of a circuit, a method using a recessed channel array transistor (RCAT) in which a gate is arranged three-dimensionally so as to prevent leakage current due to a short-channel effect is now employed (see Non-Patent Document 1).

REFERENCE

Patent Document

[Patent Document 1] U.S. Pat. No. 5,302,843
[Patent Document 2] U.S. Pat. No. 4,777,625

Non-Patent Document

[Non-Patent Document 1] K. Kim, "Technology for sub-50 nm DRAM and NAND flash manufacturing", *Technical Digest of International Electron Devices Meeting*, pp. 333-336, 2005.

SUMMARY OF THE INVENTION

However, it is difficult to further increase the integration degree with a planar transistor and an RCAT that is a modification thereof without a reduction in line width of a circuit. For example, the area of a memory cell including a planar transistor is greater than or equal to $8F^2$ (F: feature size) in a folded bit line structure and greater than or equal to $6F^2$ in an open bit line structure. A technique to achieve a much smaller area, e.g., $4F^2$ is now expected.

The present invention has been made in view of the above problem and its object is, for example, to provide a semiconductor memory device whose area can be reduced as much as possible, a configuration of a circuit of the semiconductor memory device, and a method for manufacturing the semiconductor memory device. Another object is to provide a semiconductor memory device in which the parasitic capacitance of a bit line can be reduced, a configuration of a circuit of the semiconductor memory device, and a method for manufacturing the semiconductor memory device. Further, another object is to provide a highly reliable semiconductor device with excellent characteristics and a method for manufacturing the semiconductor device.

An embodiment of the present invention is a semiconductor memory device including: a bit line formed over a substrate, an insulator including a pair of grooves formed over the bit line, a first word line and a second word line formed at side surfaces of the pair of grooves and facing with each other with the insulator interposed therebetween, a film-shaped semiconductor region interposed between side surfaces of the insulator and the first and second word lines, an electrode provided at a top of the insulator, and a capacitor provided over the insulator and electrically connected to the electrode.

In this specification, a bit line may be considered as a wiring connected to a sense amplifier or a wiring whose potential is amplified by a sense amplifier. A word line may be considered as a wiring connected to a gate of a cell transistor. In addition, a pair of grooves may also be considered as one convex shape, and one of the pair of grooves may be connected to the other. The shape of the groove is not limited to a straight line shape, and a net-like shape or another shape may be employed. Further, the groove may be connected to another groove.

Here, the bit line and the semiconductor region are preferably electrically connected to each other at a bottom of each of the grooves. The depth of each of the grooves of the insulator may be greater than or equal to twice and less than or equal to 20 times, preferably greater than or equal to 5 times and less than or equal to 20 times the width thereof. A conductive layer may be provided in contact with the semiconductor region at the top of the insulator. The height of each of the word lines may be greater than or equal to 30% and less than or equal to 90%, preferably greater than or equal to 40% and less than or equal to 80% of the depth of each of the grooves.

Another embodiment of the present invention is a semiconductor memory device including: a bit line formed over a substrate, a first insulator formed over the bit line, a stripe-shaped second insulator formed over the first insulator, a first word line and a second word line formed at side surfaces of the second insulator and facing with each other with the second insulator interposed therebetween, a film-shaped semiconductor region interposed between side surfaces of the second insulator and the first and second word lines, an electrode provided at a top of the second insulator, and a capacitor provided over the second insulator and electrically connected to the electrode.

Here, the bit line and the semiconductor region are preferably electrically connected to each other through an electrode provided in the first insulator. The height of the second insulator may be greater than or equal to twice and less than or equal to 20 times, preferably greater than or equal to 5 times and less than or equal to 20 times the distance between the second insulator and another second insulator adjacent thereto. A conductive layer may be provided in contact with the semiconductor region at the top of the second insulator. The height of each of the first and second word lines may be greater than or equal to 30% and less than or equal to 90%, preferably greater than or equal to 40% and less than or equal to 80% of the sum of the height of the second insulator and the height of the conductive layer.

Another embodiment of the present invention is a method for manufacturing a semiconductor memory device, including: a step of forming a bit line over a first insulator, a step of forming a second insulator over the bit line, a step of forming first contact holes in the second insulator, a step of forming a third insulator over the second insulator, a step of providing at least two grooves in the third insulator by etching the third insulator, a step of providing an island-shaped or stripe-shaped semiconductor region in a region including side surfaces of the grooves in the third insulator, a step of forming a conductive film, a step of forming word lines at the side surfaces of the grooves in the third insulator by performing anisotropic etching on the conductive film, a step of forming a fourth insulator, and a step of forming a second contact hole reaching a top of the third insulator between the two grooves by etching the fourth insulator.

In the step of providing the grooves in the third insulator and the step of forming the second contact hole reaching the top of the third insulator, another film serving as an etching stopper may be used to control the etching. In addition, the two grooves may also be considered as one convex shape.

It is preferable that the two word lines operate in synchronization with each other in any of the above embodiments. A driver circuit such as a sense amplifier or a decoder may be provided below the bit line. The bit line and another bit line adjacent thereto may be different from each other in height or depth. Further, any of the above structures can be applied to a divided bit line structure.

In any of the above embodiments, the semiconductor region is preferably formed of a semiconductor with a mobility of higher than or equal to 5 $cm^2/Vs$. For example, polycrystalline silicon, polycrystalline germanium, polycrystalline silicon germanium, indium oxide, an oxide obtained by adding one or more kinds of metal elements to indium oxide, gallium nitride, a compound obtained by adding oxygen to gallium nitride, gallium arsenide, indium arsenide, zinc sulfide, or the like may be used.

Although a structure in which a gate is provided on a side surface of a convex shape formed in a semiconductor substrate in a transistor with the use of anisotropic etching is known (e.g., Patent Document 1), a more preferable mode in the case of manufacturing a more integrated semiconductor memory using this structure has not been considered. For example, there is a description about a DRAM in Patent Document 1; however, a bit line is connected to a transistor through a contact provided over a convex shape, not at the bottom of a groove.

Although there has been no problem in a circuit which is not sufficiently miniaturized, there are many problems when a bit line is provided over a capacitor in a circuit which is miniaturized and in which the height of a capacitor is greater than 1 μm. That is, a bit line cannot be provided over a capacitor now, and it is necessary to form a bit line in a space in the capacitor.

In the case of providing a contact for a capacitor at the bottom of a groove, the width of the bottom needs to be large so as to prevent contact with the word line in a depression; specifically, a width of 2F is at least necessary for the bottom. Provided that the width of the top is defined as F, even if a contact is common between bit lines of the adjacent memory cells, an element isolation region for isolation from the adjacent capacitor needs to be formed, so that the area of the memory cell cannot be smaller than $6F^2$.

Further, since the bit line is provided close to the capacitor or the word line, the parasitic capacitance of the bit line is increased. The capacitance of a capacitor depends on the parasitic capacitance of a bit line in a DRAM; thus, when the parasitic capacitance is increased, the capacitance of the capacitor is inevitably increased.

These problems can be solved by arranging a bit line below a semiconductor region. That is, a contact to the bit line in a lower portion is provided at the bottom of a groove, and a contact to a capacitor in an upper portion is provided at the top between two grooves (at the top of the convex shape). The contact at the bottom is a contact from the lower portion; therefore, it is not necessary to avoid the word line provided in the groove, which is a point different from that in Patent Document 1. Therefore, by setting both the width of the bottom of the groove and the width of the convex shape to F, the area of the memory cell can be $4F^2$.

In addition, an element isolation region is not particularly needed between the adjacent capacitors. This is because in the above structure, the capacitor is arranged between two transistors, and gates of the two transistors correspond to a pair of word lines at the side surfaces of one convex shape. Thus, unless the pair of word lines are active, the capacitor is in an insulated state.

The element isolation region is formed to only keep isolation; in the above structure, the transistor has a function similar to that of the element isolation region. Therefore, as described later, when the transistor is on, the transistor functions as a transistor, and when the transistor is off, the transistor functions as an element isolation region, so that the use efficiency is high.

It is needless to say that, since parasitic capacitance is generated between the semiconductor region and the word line, an unnecessary portion in the semiconductor region (where the transistor is not formed) may be omitted.

In the above structure, the bit line is apart from the capacitor or the word line, so that the parasitic capacitance therebetween can be reduced. When the parasitic capacitance of the bit line is small, the capacitance of the capacitor provided in the memory cell can be small accordingly.

In the above structure, the channel length of the transistor is substantially equal to the height of the word line which depends on the depth of the groove. Therefore, when the aspect ratio of the groove (the value obtained by dividing the depth by the width) is large, a transistor which is sufficiently integrated and in which a short-channel effect is suppressed can be obtained.

For example, in the case where the width of the groove is 30 nm, which is a feature size, and the height thereof is 300 nm, the height of the word line can be 300 nm at maximum. In an actual case, in consideration of process margin or the like, the height of the word line may be set to greater than or equal to 30% and less than or equal to 90%, preferably greater than or equal to 40% and less than or equal to 80% of the depth of the groove. For example, when the height of the word line is 50% of the depth of the groove, the channel length is approximately 150 nm.

This is substantially the same channel length as an RCAT, and a short-channel effect can be sufficiently suppressed. Moreover, in the above structure, since there are two transistors each having a channel width of 30 nm in one memory cell, the on-state current can be twice that of a general RCAT or the memory cell described in Patent Document 1.

Since the channel width is 30 nm which is a feature size, the channel length is five times the channel width. In such a transistor having a large channel length, variation in threshold voltage can be small in the case of using particularly a polycrystalline semiconductor material.

In the case of an aspect ratio of 2 which means a relatively shallow groove as well as in the case of an aspect ratio of 10, it is highly difficult from a technical aspect to form a contact from the bottom of the groove to an upper portion in a manner similar to that of the memory cell described in Patent Document 1.

On the other hand, in the above structure, a contact to a lower portion is provided at the bottom of a groove, and a contact to an upper portion is provided at the top between two grooves. Such a structure is the most easily processed and preferable for the integration. Therefore, even if a groove has an aspect ratio of greater than or equal to 2 and less than or equal to 20, preferably greater than or equal to 5 and less than or equal to 20, a memory cell can be formed by employing the above structure.

In the above structure, the bit line is provided below the cell transistor and a component which can be an obstacle is not particularly provided in that region, so that the depth at which the bit line is arranged can be set as appropriate. It is needless to say that the bit line can be formed apart from the transistor (that is, in a deep position) to further reduce the parasitic capacitance. In addition, when the depth of a bit line is made different from that of another bit line adjacent thereto, parasitic capacitance generated between the adjacent bit lines can be reduced.

By providing a circuit for driving the bit line below the bit line, the area of the chip can be reduced. In general, a driver circuit occupies 20% to 50% of the area of the surface of a DRAM chip. Thus, when the driver circuit and the memory cell array overlap with each other, the chip area can be decreased. Also, when a memory has the same area as a conventional memory, more memory cells can be formed. The driver circuit is preferably formed using a single crystal semiconductor.

The mobility of a transistor including a semiconductor region having non-single crystal is not high enough in some cases. However, when a so-called divided bit line structure (see Patent Document 2) is employed, by setting the capacitance of a sub-bit line and the capacitance of a capacitor to a tenth to a hundredth of that of a general DRAM, high-speed operation which is higher than or equal to that of a DRAM including single crystal silicon is possible even when the mobility of a semiconductor material is a tenth to a hundredth of that of single crystal silicon which is generally used.

A memory cell connected to a sub-bit line in the divided bit line structure is equal to a memory cell connected to a bit line in a general DRAM; thus, the bit line having the structure and the effect in the above embodiment may be considered similarly to the sub-bit line in the divided bit line structure. By forming the sub-bit line apart from the word line or the capacitor, the parasitic capacitance of the sub-bit line can be reduced, so that the capacitance of the capacitor can be further reduced.

In addition, a bit line in the divided bit line structure (also referred to as a main bit line) may be provided over a capacitor. In the divided bit line structure, the height of the capacitor can be a tenth to a hundredth of that in a general DRAM; therefore, it is easy from a technical aspect to form the bit line over the capacitor. An area of greater than or equal to $4F^2$ is needed in some cases for a contact between the bit line and the sub-bit line; however, one contact is necessary in 10 to 200 memory cells, so that the chip area is not significantly increased.

Further, a sense amplifier or the like which is used to amplify the potential of the sub-bit line in the divided bit line structure may be provided below the bit line, preferably, formed using a single crystal semiconductor together with other driver circuits.

DETAILED DESCRIPTION OF THE INVENTION

Hereinafter, embodiments will be described with reference to drawings. However, the embodiments can be implemented in many different modes. It will be readily appreciated by those skilled in the art that modes and details thereof can be changed in various ways without departing from the spirit and the scope of the present invention. Thus, the present invention should not be interpreted as being limited to the following description of the embodiments.

In this specification, ordinal numbers such as "first" and "second" are used to avoid confusion among components and do not necessarily mean the order. For example, another insulator may be provided below a first insulator, or another contact plug may be provided between a first contact plug and a second contact plug.

In addition, in this specification, a source of a cell transistor denotes an electrode or a region on the bit line side, and a drain of a cell transistor denotes an electrode or a region on the capacitor side.

Embodiment 1

Figure 5A:
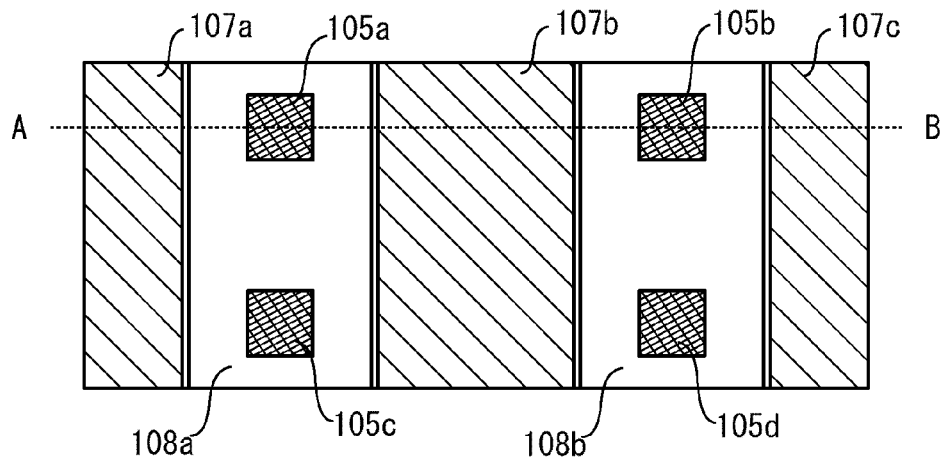
FIGS. 5A to 5C illustrate an example of a manufacturing process of a semiconductor memory device according to an embodiment of the present invention.
Figure 5B:
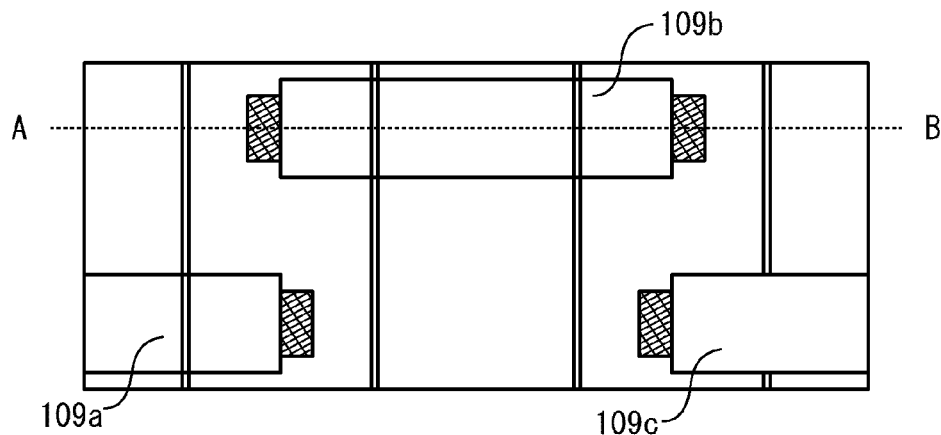
Figure 5C:
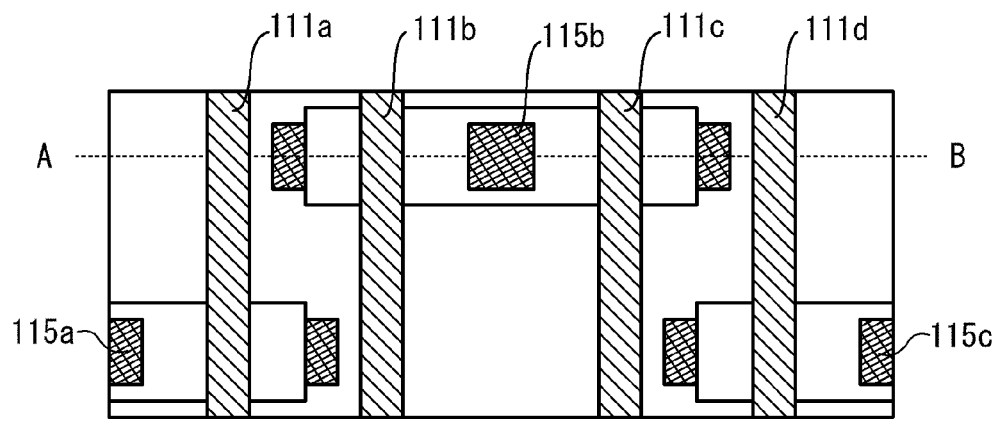
Figure 6:
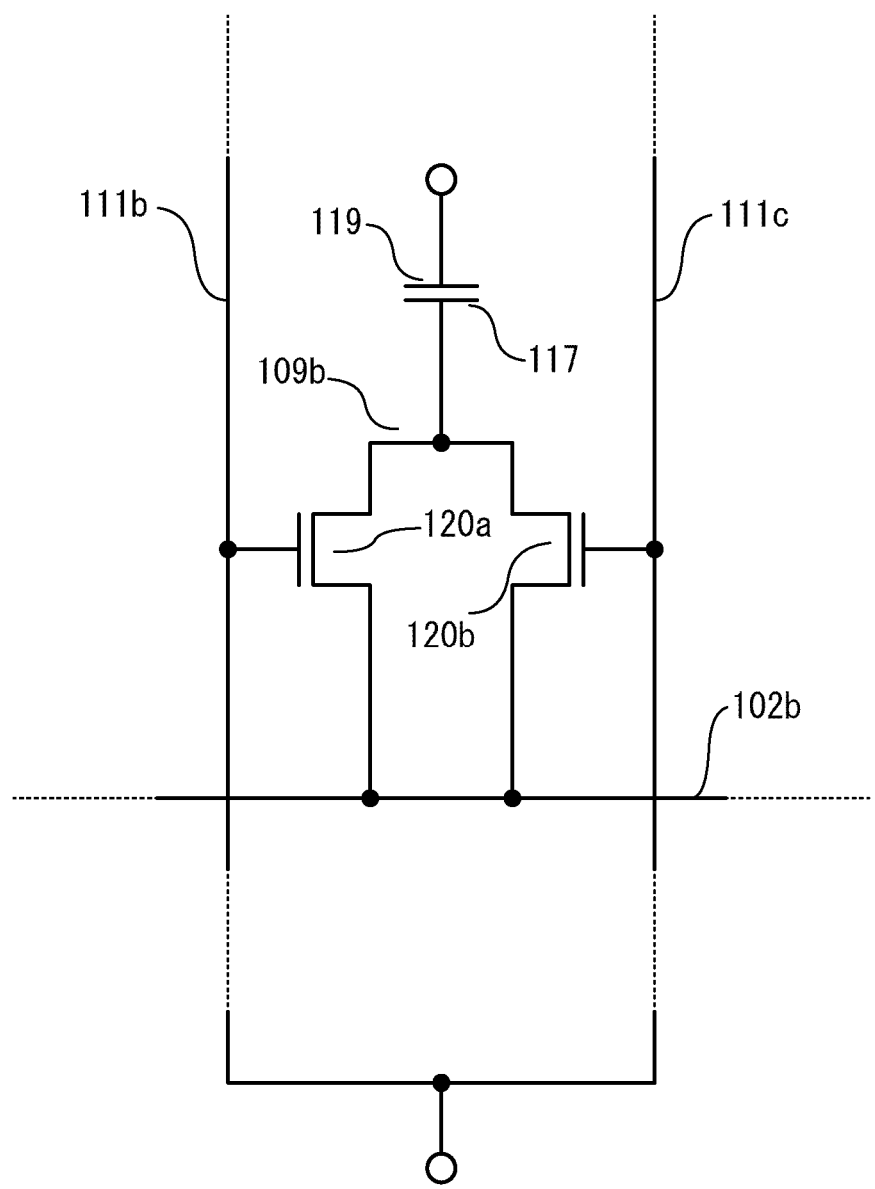
FIG. 6 illustrates an example of a circuit applied to a semiconductor memory device according to an embodiment of the present invention.
Figure 7A:
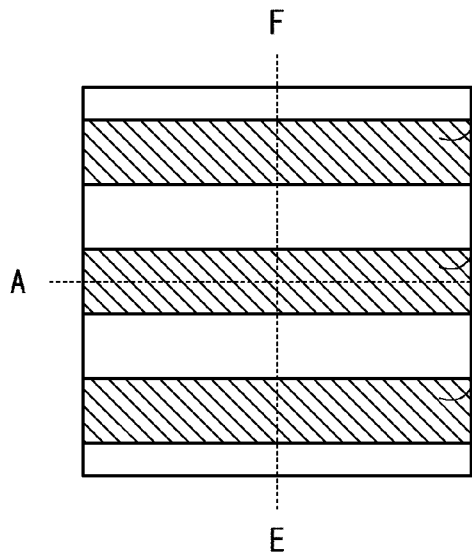
FIGS. 7A to 7D each illustrate an example of a structure of a semiconductor memory device according to an embodiment of the present invention.
Figure 7B:
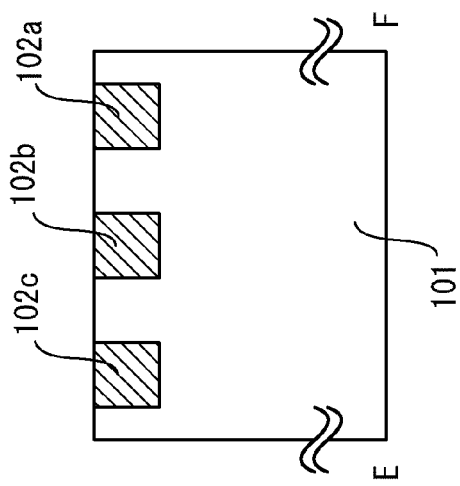
Figure 7C:
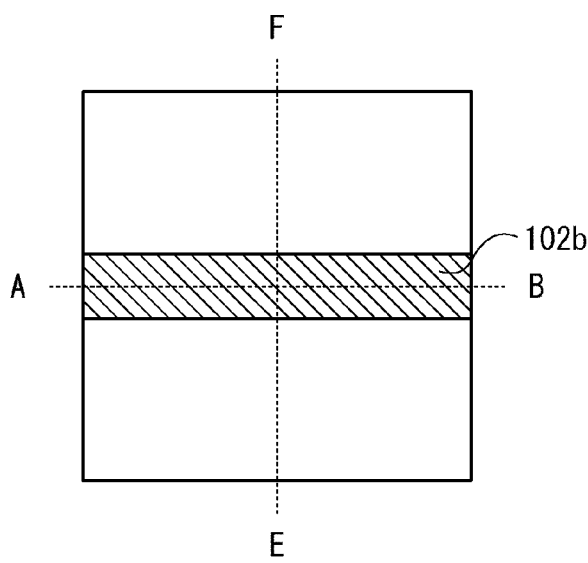
Figure 7D:
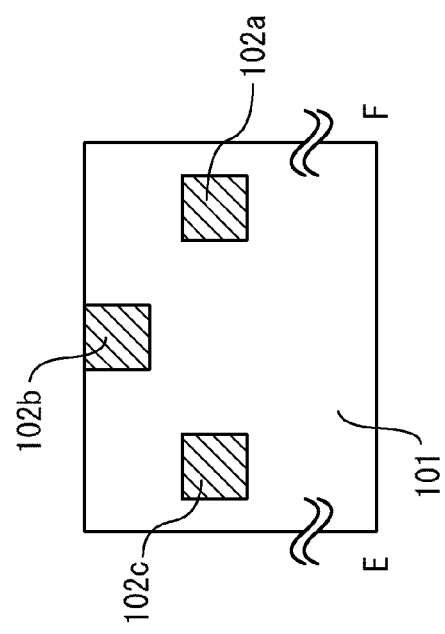

A manufacturing process of a memory cell according this embodiment will be described with reference FIGS. 1A and 1B, FIGS. 2A and 2B, FIGS. 3A and 3B, FIG. 4, FIGS. 5A to 5C, FIG. 6, and FIGS. 7A to 7D. FIGS. 1A and 1B, FIGS. 2A and 2B, FIGS. 3A and 3B, and FIG. 4 each illustrate a cross section parallel to a bit line of the memory cell according to this embodiment. FIGS. 5A to 5C are schematic views each illustrating a manufacturing step in the case where the memory cell according to this embodiment is seen from the above. FIG. 6 is a circuit diagram of the memory cell according to this embodiment. FIGS. 7A and 7C are schematic views in the case where the bit line according to this embodiment is seen from the above and FIGS. 7B and 7D are cross-sectional views corresponding to FIGS. 7A and 7C, respectively.

In this embodiment, with a few exceptions, just an outline is described. A known technique for forming a semiconductor integrated circuit or the like may be referred to for the details. In addition, although in FIGS. 1A and 1B, FIGS. 2A and 2B, FIGS. 3A and 3B, FIG. 4, and FIGS. 5A to 5C, a memory cell of a folded bit line structure is illustrated and the area of one memory cell is set to approximately $16F^2$ for easy understanding of the description, the integration degree may be higher.

<FIG. 1A>

Figure 1A:
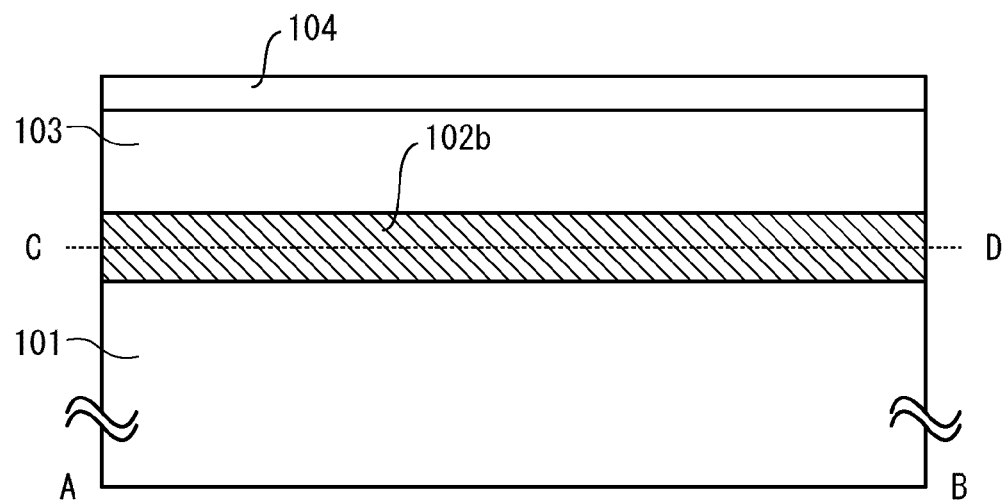
FIGS. 1A and 1B illustrate an example of a manufacturing process of a semiconductor memory device according to an embodiment of the present invention.
Figure 1B:
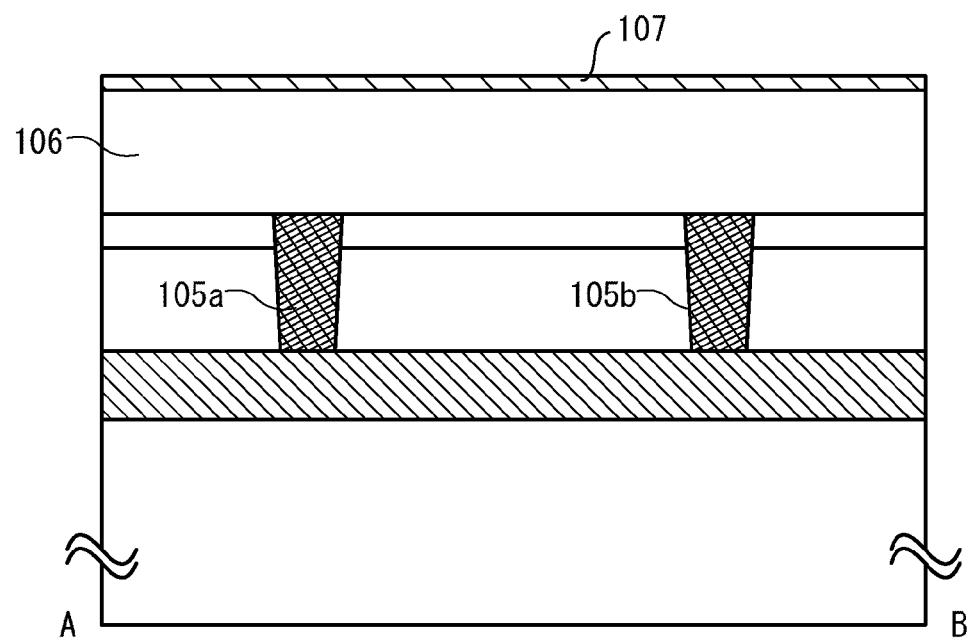

A bit line 102b is formed over a first insulator 101. There are some methods for arrangement of a bit line adjacent to the bit line 102b. For example, as illustrated in FIGS. 7A and 7B, there is a method in which bit lines 102a and 102c adjacent to the bit line 102b are formed at the same depth or in the same layer as the bit line 102b. FIG. 7A is a schematic view of a cross section obtained by cutting a plane in which the bit lines 102a to 102c are formed along a plane including dotted line C-D in FIG. 1A. FIG. 7B illustrates a cross section along dotted line E-F in FIG. 7A. Note that FIG. 1A illustrates a cross section along dotted line A-B in FIGS. 7A and 7C.

The method in which the bit line 102b is formed at the same depth or in the same layer as the bit lines 102a and 102c adjacent to the bit line 102b as illustrated in FIG. 7B is characterized by a small number of manufacturing steps.

Another method is a method in which the bit lines 102a and 102c adjacent to the bit line 102b are each formed at a depth or in a layer which is different from that of the bit line 102b as illustrated in FIGS. 7C and 7D. FIG. 7C is a schematic view illustrating a cross section along a plane including dotted line C-D in FIG. 1A. FIG. 7D illustrates a cross section along dotted line E-F in FIG. 7C.

In FIG. 7C, although the bit lines 102a and 102c adjacent to the bit line 102b are not illustrated, the bit lines 102a and 102c are formed at a depth which is different from that of the bit line 102b as illustrated in FIG. 7D which is a cross-sectional view. In FIG. 7D, the bit lines are formed at two kinds of depths but may also be formed at three or more kinds of depths.

Additional manufacturing steps are needed in this method; however, the parasitic capacitance between the adjacent bit lines can be reduced compared to the method in which the bit lines are formed in the same layer (FIG. 7B). For example, the height of each of the bit lines 102a to 102c is five times the width thereof and the distance between the bit lines is the same as the width thereof; when the depth of one bit line is different from the depth of the adjacent bit line by the height of the bit line as illustrated in FIG. 7D, the parasitic capacitance between one bit line and another bit line is reduced to half or less. As the height of the bit line is increased (as the aspect ratio is increased), the effect of reducing the parasitic capacitance is improved.

When a bit line is formed apart from a word line or a capacitor as in this embodiment, most of the parasitic capacitance of the bit line is generated between the bit line and another bit line. In particular, in order to reduce the width of a wiring and the resistance of the bit line, the aspect ratio of the bit line needs to be increased, which also increases the parasitic capacitance between the bit lines.

Therefore, the effect of reducing the parasitic capacitance of the bit line by arranging the bit lines as illustrated in FIG. 7D is advantageous. In the case where a reduction in parasitic capacitance of the bit line, a reduction in resistance of the bit line, and a reduction in capacitance of the capacitor are expected at the same time, the bit lines are preferably arranged as illustrated in FIG. 7D.

In a conventional DRAM, arrangement of a bit line is strictly limited because a component such as a capacitor is provided in a region where the bit line is arranged; in this embodiment, the capacitor is formed apart from the bit line, so that the bit line can be arranged relatively freely and the bit lines can be formed at different depths as described above. In this embodiment, any of the methods illustrated in FIGS. 7B and 7D can be employed.

In FIG. 1A, over the bit line 102b, a second insulator 103 and a third insulator 104 which has a barrier property against hydrogen and an alkali metal are each formed to have an appropriate thickness. Note that the thickness and the material of each of the first insulator 101, the second insulator 103, and the third insulator 104 are important to estimate the parasitic capacitance of the bit line.

The thickness of each of the first insulator 101 and the second insulator 103 is preferably 100 nm to 1 µm. In addition, the first insulator 101 and the second insulator 103 may each be formed using a material having a relatively low dielectric constant such as silicon oxide. Further, the third insulator 104 is preferably formed using a material whose etching rate is different from that of a fourth insulator 106 formed over the third insulator 104, e.g., aluminum oxide, aluminum nitride, silicon nitride, or the like with a thickness of 10 nm to 100 nm.

The third insulator 104 and the second insulator 103 are etched to form contact holes, and first contact plugs 105a and 105b connected to the bit line 102b are formed. Further, the fourth insulator 106 is formed. The thickness of the fourth insulator 106 is determined in consideration of the depth of a groove formed later and the channel length of a transistor, and is 100 nm to 1 µm for example. In addition, the fourth insulator 106 is preferably formed using a material whose etching rate is different from that of the material for the third insulator 104, and silicon oxide may be used.

A conductive layer 107 is formed over the fourth insulator 106. The material and the thickness of the conductive layer 107 may be determined as appropriate and are preferably those which can provide a function of an etching stopper when a second contact plug 115b is formed later.

<FIG. 2A>

The conductive layer 107 and the fourth insulator 106 are etched to form grooves 108a and 108b. The grooves 108a and 108b are formed so as to be substantially orthogonal to the bit line 102b. In the etching of the relatively thick fourth insulator 106, the third insulator 104 is used as an etching stopper. That is, the etching of the fourth insulator 106 is stopped when the third insulator 104 is exposed. As a result, the fourth insulator 106 and the conductive layer 107 are processed into fourth insulators 106a to 106c and conductive layers 107a to 107c which are in a stripe shape, for example. Note that the shape of each of the fourth insulators 106a to 106c and the conductive layers 107a to 107c is not limited to a stripe shape. In addition, the ratio of the depth T of the groove to the width W of the groove (T/W) in the drawing is greater than or equal to 2 and less than or equal to 20, preferably greater than or equal to 5 and less than or equal to 20.

<FIG. 2B>

An island-shaped semiconductor region 109b is formed. The semiconductor region 109b is formed in contact with at least one of the first contact plugs 105a and 105b. At this time, the conductive layers 107a to 107c are also etched using the semiconductor region 109b as a mask. Accordingly, regions in the conductive layers 107a to 107c over which the semiconductor region 109b is not provided are removed. In FIG. 2B, part of the conductive layer 107b remains to become a conductive layer 107B. After that, a gate insulator 110 is formed so as to cover the island-shaped semiconductor region 109b.

The thicknesses of the semiconductor region 109b and the gate insulator 110 can be determined as appropriate but preferably determined depending on the channel length of the transistor or the width W of the groove, for example, may be set to a fiftieth to a fifth of the channel length or a tenth to a fiftieth of the width W of the groove. Note that the gate insulator 110 may be thinned to such a level that a tunneling current or the like does not cause a problem. In addition, the gate insulator 110 may be formed using a material whose relative dielectric constant is greater than or equal to 10.

The gate insulator 110 may be formed using a material whose etching rate is different from that of a material used for word lines 111a to 111d formed later or a material that is used for a fifth insulator 112. In such a sense, hafnium oxide, tantalum oxide, aluminum oxide, zirconium oxide, or the like may be used. The gate insulator 110 may also be a multilayer film including the above. For example, a two-layer film including silicon oxide and aluminum oxide may be used.

There is no limitation on the kind of a semiconductor used for the semiconductor region 109b but the mobility thereof is preferably higher than or equal to 5 cm$^2$/Vs. For example, polycrystalline silicon, polycrystalline germanium, polycrystalline silicon germanium, indium oxide, an oxide obtained by adding a metal element to indium oxide, gallium nitride, a compound obtained by adding oxygen to gallium nitride, gallium arsenide, indium arsenide, zinc sulfide, or the like may be used.

In particular, in the case where the capacitance of the capacitor is reduced by employing a divided bit line structure, the off resistance needs to be higher than that of a cell transistor of a general DRAM. For example, even when the capacitance of the capacitor is reduced to a hundredth, unless the off resistance of the cell transistor is changed, electric charge accumulated in the capacitor disappear for a period which is a hundredth of that of a general DRAM. Accordingly, refresh operation needs to be performed at an interval of a hundredth of that of a general DRAM, resulting in a significant increase in power consumption. That is, it is preferable that when the capacitance of the capacitor is reduced to a hundredth, the off resistance of the cell transistor be increased hundred or more times.

In order to increase the off resistance, for example, it is effective to significantly reduce the thickness of the semiconductor region 109b to 0.5 nm to 5 nm. In addition, preferably, while the depth T of the grooves 108a and 108b is set to 0.5 µm to 1 µm, the channel length of the cell transistor is increased. Further, when the original mobility is higher than or equal to 200 cm$^2$/Vs as in the case of polycrystalline silicon, the mobility may be reduced to approximately 10 cm$^2$/Vs by setting the nitrogen concentration or the carbon concentration in the semiconductor region to $1 \times 10^{19}$ cm$^{-2}$ to $5 \times 10^{20}$ cm$^{-3}$.

It is preferable to further increase the off resistance of the cell transistor because the refresh interval of the memory cell can be lengthened. For example, when the off resistance is million times or more that of a general cell transistor, the cell transistor can be used practically without refresh operation.

In order to obtain such a very high off resistance, silicon (whose band gap is 1.1 eV) is not enough. It is necessary to use a wide band gap semiconductor whose band gap is greater than or equal to 2.5 eV and less than or equal to 4 eV, preferably greater than or equal to 3 eV and less than or equal to 3.8 eV. For example, an oxide semiconductor such as indium oxide or zinc oxide, a nitride semiconductor such as gallium nitride, a sulfide semiconductor such as zinc sulfide, or the like may be used.

The off resistance is proportional to the concentration of carriers excited by heat. Since the band gap of silicon is 1.1 eV even when carriers caused by a donor or an acceptor do not exist at all (intrinsic semiconductor), the concentration of carriers excited by heat at room temperature (300 K) is approximately $1 \times 10^{11}$ cm$^{-3}$.

On the other hand, in the case of a semiconductor whose band gap is 3.2 eV, the concentration of carriers excited by heat is approximately $1 \times 10^{-7}$ cm$^{-3}$. When the electron mobility is the same, the resistivity is inversely proportional to the carrier concentration, so that the resistivity of the semiconductor whose band gap is 3.2 eV is 18 orders of magnitude higher than that of silicon.

It is preferable that the concentration of carriers excited by a donor or an acceptor be as low as possible, e.g., lower than or equal to $1 \times 10^{12}$ cm$^{-3}$. In addition, the threshold voltage of the transistor depends on the concentration of carriers excited by a donor or an acceptor.

<FIG. 3A>

A conductive film is formed and subjected to anisotropic etching to form the word lines 111a to 111d. The thickness of the conductive film is preferably a third to a thirtieth of the width W of the grooves 108a and 108b. The width x of the word lines 111a to 111d in the drawing substantially equals to the thickness of the conductive film. When the conductive film is too thick, the conductive film cannot be divided in the groove even if the anisotropic etching is performed. Patent Document 1 may be referred to for a technique for forming a wiring at a side surface of a groove in a self-aligned manner as described above.

In the case where the top of the word line 111b and the top of the word line 111c are positioned at a level higher than the top of the fourth insulator 106b or at a level substantially the same as a level of the conductive layer 107B, the word lines 111b and 111c might be in contact with the second contact plug 115b which is formed later. Therefore, the height of the word lines 111a to 111d is preferably greater than or equal to 30% and less than or equal to 90%, more preferably greater than or equal to 40% and less than or equal to 80% of the depth T of the groove.

Through the above, the conductive layer 107B and the word lines 111b and 111c may be in an offset state (a state where the conductive layer 107B and the word lines 111b and 111c do not overlap with each other). In order to prevent a short-channel effect, an offset region is preferably provided to be 10 nm to 50 nm long in the perpendicular direction or extend 20% to 100% of the height of the word lines 111b and 111c.

Note that in the cell transistor of this embodiment, the source and the drain are asymmetrical regarding the offset structure. It is highly difficult or not possible from a technical aspect to provide an offset region on the source side (on the bit line side) particularly when the integration degree is high, whereas it is relatively easy to provide the offset region on the drain side (on the capacitor side) because it is only necessary to adjust the height of the word lines 111b and 111c.

In particular, in a state where electric charge is held in the capacitor (in a state where the transistor is off), the drain has the same potential as or higher potential than the bit line when the cell transistor is n-type. Under such a condition, the off resistance can be more increased in the case where the offset region on the drain side is enlarged than in the case where the offset region on the source side is enlarged.

That is, on the source side, the offset region is not provided or the offset region is provided to have a shape overlapping with a gate (the word lines 111b and 111c) and the first contact plugs 105a and 105b. On the other hand, the offset region is provided in the above range on the drain side, so that the off resistance can be increased and electric charge accumulated in the capacitor can be prevented from leaking.

When the word lines 111b and 111c overlap with a source (the first contact plugs 105a and 105b), an unnecessary change in potential could be caused in charging of the capacitor. However, in the case where the aspect ratio of the grooves 108a and 108b is greater than or equal to 5 and less than or equal to 20, the parasitic capacitance between the word lines 111b and 111c and the source is approximately 20% of gate capacitance (capacitance caused by overlapping of the word lines 111b and 111c with the semiconductor region 109b) at most, which is ignorable when the capacitance of the capacitor is set to be ten or more times of gate capacitance.

It is preferable to provide another semiconductor integrated circuit in a lower layer of the bit line 102b so as to increase the integration degree. This also applies to other embodiments. However, in general, in the case where the semiconductor integrated circuit is provided in the lower layer, noise caused by the circuit may hinder the operation of the transistor in an upper layer. Against this problem, a shield layer may be provided below the transistor in the upper layer and noise may be absorbed. In this embodiment, the bit line 102b is arranged to overlap with the semiconductor region 109b, so that the bit line 102b serves as a shield layer to absorb noise.

In the case where the semiconductor region is formed at the side surface of the convex shape, the semiconductor region might be influenced by a wiring or an electrode formed at an opposite side surface of the convex shape when the integration degree is increased. However, in this embodiment, the word lines 111b and 111c operate as a pair of word lines and the same potential is applied thereto; thus, the transistor characteristics are not adversely affected.

Further, an impurity may be implanted into the semiconductor region 109b using the word lines 111b and 111c as a mask by an ion implantation method or the like to form an n-type or p-type region (doped region). However, the doped region is not necessarily formed in the case where the distance between the word line 111b and a region where the first contact plug 105a is in contact with the semiconductor region 109b, the distance between the word line 111c and a region where the first contact plug 105b is in contact with the semiconductor region 109b, the distance between the word line 111b and a region where the second contact plug 115b is in contact with the semiconductor region 109b, the distance between the word line 111c and the region where the second contact plug 115b is in contact with the semiconductor region 109b, the distance between the word line 111b and the conductive layer 107B, or the distance between the word line 111c and the conductive layer 107B is less than or equal to 30 nm, preferably less than or equal to 10 nm.

Further, the doped region is not necessarily formed either, in the case where the semiconductor region 109b has any conductivity type from the beginning and the transistor can be controlled by utilizing a difference in work function between the semiconductor material for the semiconductor region 109b and the material for the word lines 111b and 111c. For example, polycrystalline silicon over silicon oxide has n-type conductivity even when it is not doped with an impurity; when a material having a work function of higher than or equal to 5 eV such as indium nitride, zinc nitride, or p-type silicon is used for the word lines 111b and 111c, electrons are removed owing to such a material, so that an n-type transistor whose threshold voltage is positive can be formed.

<FIG. 3B>

The fifth insulator 112 is formed. The fifth insulator 112 is preferably formed using a material with low dielectric constant and to fill the grooves 108a and 108b. Then, the surface of the fifth insulator 112 is flattened. The flattening process is stopped when the gate insulator 110 is exposed. Then, a sixth insulator 113 and a seventh insulator 114 are formed over the fifth insulator 112.

The sixth insulator 113 preferably has a barrier property against hydrogen and an alkali metal and is preferably formed using a material whose etching rate is different from that of the material for the seventh insulator 114. For example, aluminum oxide, aluminum nitride, silicon nitride, or the like may be used. In addition, the thickness of the sixth insulator 113 may be 10 nm to 100 nm. The seventh insulator 114 may be formed using a material with low dielectric constant such as silicon oxide.

After that, first, the seventh insulator 114 is etched to form a contact hole. The seventh insulator 114 is sufficiently thick; thus, when misalignment of a mask and excessive etching occur at the same time, the contact hole could be connected to the word lines 111b or 111c. Such a problem is likely to be caused in the case where the integration degree is high and the width of the top of the fourth insulator 106b is processed into a feature size.

Therefore, in this embodiment, the etching is temporarily stopped using the sixth insulator 113 as an etching stopper. Then, the sixth insulator 113 is etched, and then, the gate insulator 110 and in some cases, the semiconductor region 109b are etched to form a contact hole which reaches the conductive layer 107B. After that, the contact hole is filled with the second contact plug 115b.

Since the gate insulator 110 and the semiconductor region 109b are sufficiently thin, even when over-etching is caused, the contact hole can be prevented from reaching the word lines 111b and 111c by minutely controlling the etching time. For this purpose, it is preferable that the top of the word line 111b and the top of the word line 111c be located at a level sufficiently lower than a top surface of the conductive layer 107B.

<FIG. 4>

An eighth insulator 116 is formed using a material having a relatively low dielectric constant such as silicon oxide or silicon oxycarbide. A hole is formed in the eighth insulator 116 to form a capacitor therein. Then, a first capacitor electrode 117 with a thickness of 2 nm to 20 nm is formed on the inner wall of the hole. The maximum thickness of the first capacitor electrode 117 may be determined depending on the feature size F. The thickness is preferably less than or equal to 5 nm when F is 20 nm, and the thickness is preferably less than or equal to 2.5 nm when F is 10 nm.

Further, a capacitor insulator 118 with a thickness of 2 nm to 20 nm is formed. The capacitor insulator 118 can be formed using any of various high-k materials, preferably hafnium oxide, zirconium oxide, tantalum oxide, barium strontium titanate, or the like. Then, a second capacitor electrode 119 is formed. The first capacitor electrode 117, the capacitor insulator 118, and the second capacitor electrode 119 form a capacitor.

In this manner, a memory cell of a folded bit line structure which includes two cell transistors 120a and 120b and one capacitor can be manufactured.

FIGS. 5A to 5C schematically illustrate the manufacturing process seen from the above. In FIGS. 5A to 5C, cross sections along dotted line A-B correspond to FIGS. 1A and 1B, FIGS. 2A and 2B, FIGS. 3A and 3B, and FIG. 4. That is, the bit line 102b is provided so as to overlap with the dotted line A-B.

Figure 2A:
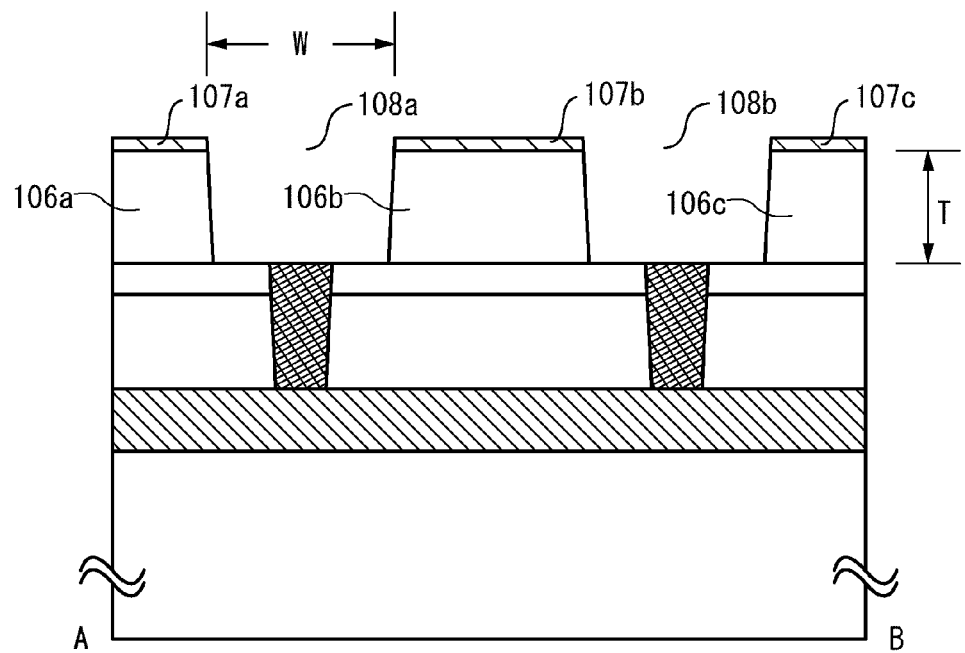
FIGS. 2A and 2B illustrate an example of a manufacturing process of a semiconductor memory device according to an embodiment of the present invention.
Figure 2B:
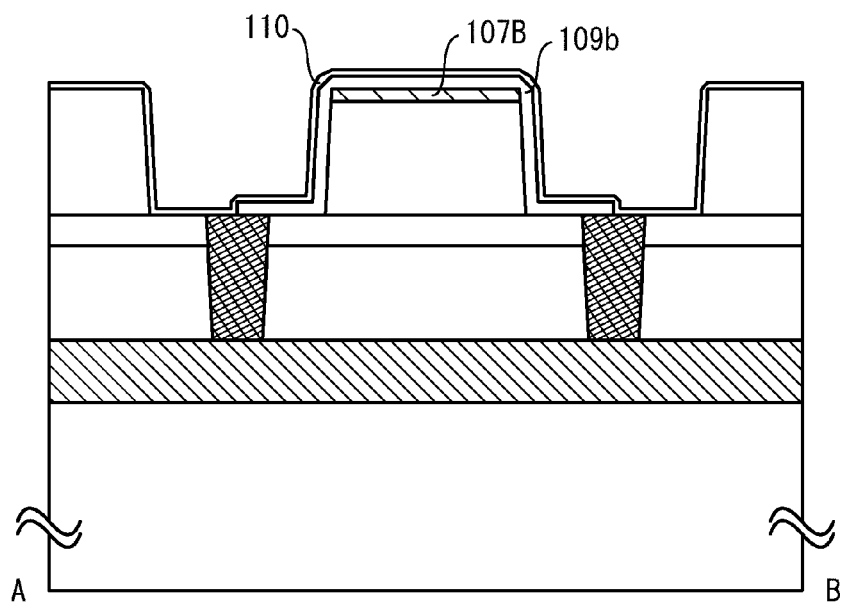

FIG. 5A corresponds to the step of FIG. 2A where the fourth insulator 106 and the conductive layer 107 are etched, and the grooves 108a and 108b are formed in the direction substantially orthogonal to the bit line and the fourth insulators 106a to 106c and the conductive layers 107a to 107c which are in a stripe shape are formed. At bottoms of the grooves, the first contact plugs 105a and 105b and first contact plugs 105c and 105d which are in another column and not illustrated in FIG. 2A (that is, connected to another bit line) are exposed.

FIG. 5B corresponds to the step of FIG. 2B. Here, the semiconductor region 109b and semiconductor regions 109a and 109c which are in another column and not illustrated in FIG. 2B are formed. Note that the bit line 102c (see FIGS. 7A to 7D) is provided below the semiconductor regions 109a and 109c in the direction substantially parallel to the dotted line A-B.

The conductive layers 107a to 107c are etched using the semiconductor regions 109a to 109c as masks. Therefore, although not illustrated, the conductive layer 107B is provided below the semiconductor region 109b as described with reference FIG. 2B. In a similar manner, conductive layers 107A and 107C (not illustrated) are provided below the semiconductor regions 109a and 109c in such a manner that the conductive layers 107a and 107c which are in a stripe shape are processed using the semiconductor regions 109a and 109c as masks.

Since the memory cell of this embodiment has a folded bit line structure, the semiconductor regions 109a to 109c each have an island shape and are formed in a staggered pattern, and one semiconductor region is used for one memory cell. In an open bit line structure described later, semiconductor regions are formed substantially in parallel to the bit line in a stripe shape, and one semiconductor region is used for a plurality of memory cells.

Figure 3A:
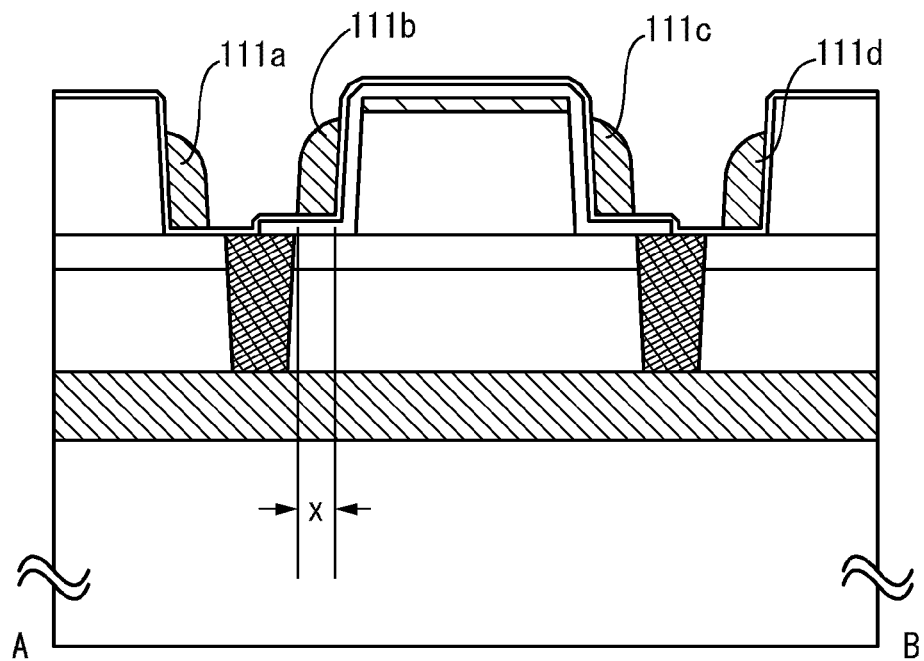
FIGS. 3A and 3B illustrate an example of a manufacturing process of a semiconductor memory device according to an embodiment of the present invention.
Figure 3B:
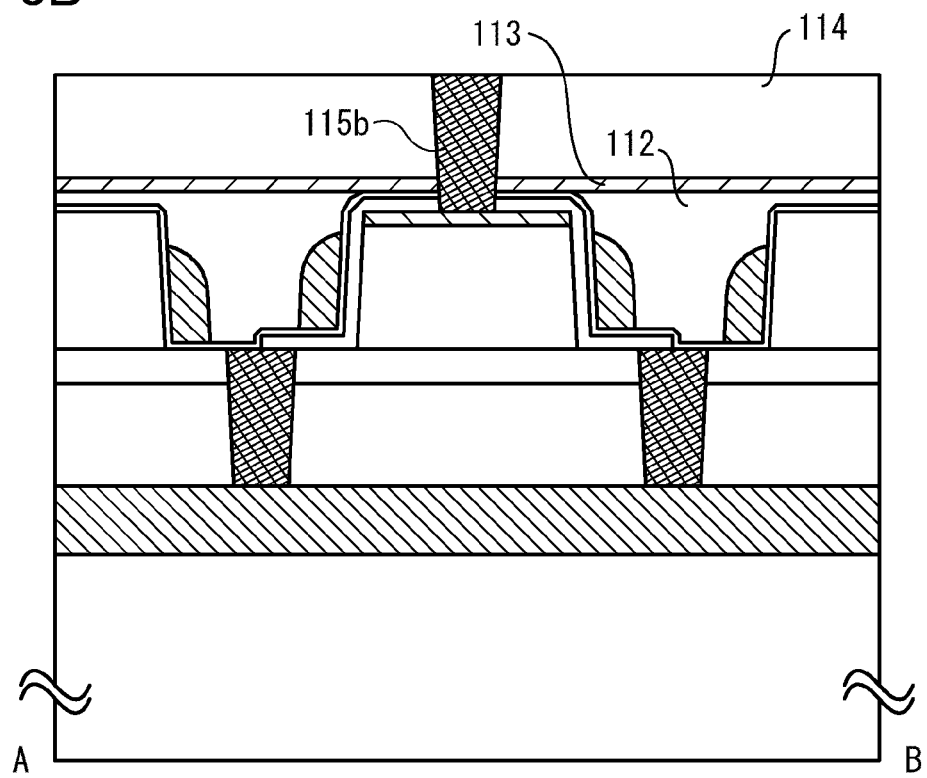
Figure 4:
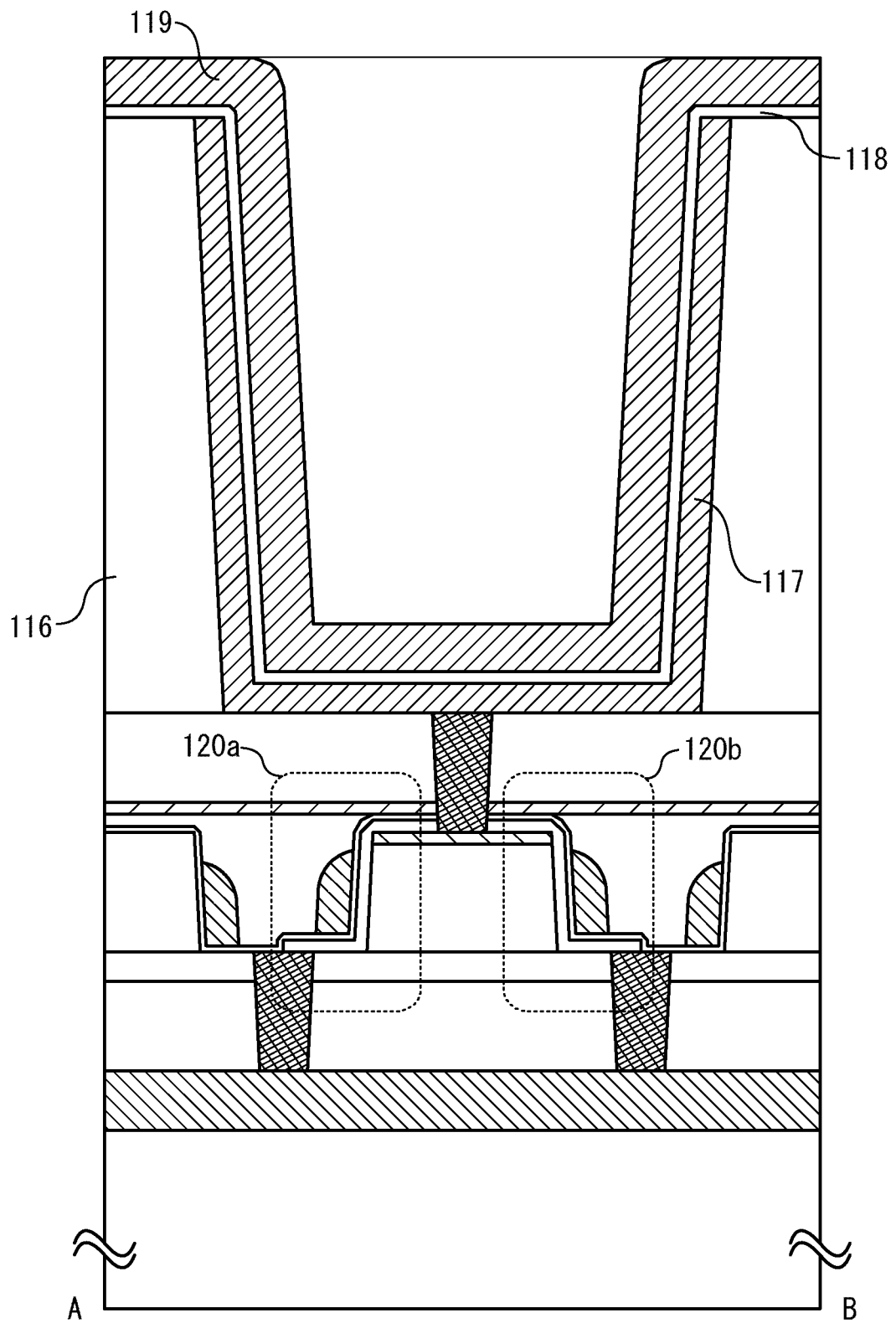
FIG. 4 illustrates an example of a manufacturing process of a semiconductor memory device according to an embodiment of the present invention.

FIG. 5C corresponds to the step of FIG. 3B where the word lines 111a to 111d are formed at the side surfaces of the grooves 108a and 108b. In FIG. 5C, the word lines 111b and 111c serve as gates of the two transistors formed using the semiconductor region 109b. Similarly, the word lines 111a and 111d serve as gates of transistors formed using the semiconductor regions 109a and 109c.

In center portions of the island-shaped semiconductor regions 109a to 109c, the second contact plugs 115a to 115c connected the capacitors are provided. Note that the second contact plugs 115a and 115c are not illustrated in FIG. 3B.

A circuit diagram of the memory cell as described above is as shown in FIG. 6. That is, in each of the cell transistor 120a including the island-shaped semiconductor region 109b and the word line 111b and the cell transistor 120b including the island-shaped semiconductor region 109b and the word line 111c, a source is connected to the bit line 102b and a drain is connected to the first capacitor electrode 117. The word lines 111b and 111c form a pair of word lines, and one ends of the pair of word lines are connected to each other so that the same signal is applied thereto.

Embodiment 2

This embodiment will be described with reference to FIG. 8. In this embodiment, a circuit (a driver circuit 202) for driving a memory cell, such as a sense amplifier or a decoder, is formed on a surface of a substrate 201 formed of a single crystal semiconductor using a known technique for forming a semiconductor integrated circuit. Over the driver circuit 202, a bit line 203 is formed, and a cell transistor layer 204 is provided thereover. Further, a capacitor layer 205 is formed thereover. Embodiment 1 is referred to for the structures of the cell transistor layer 204 and the capacitor layer 205.

Figure 8:
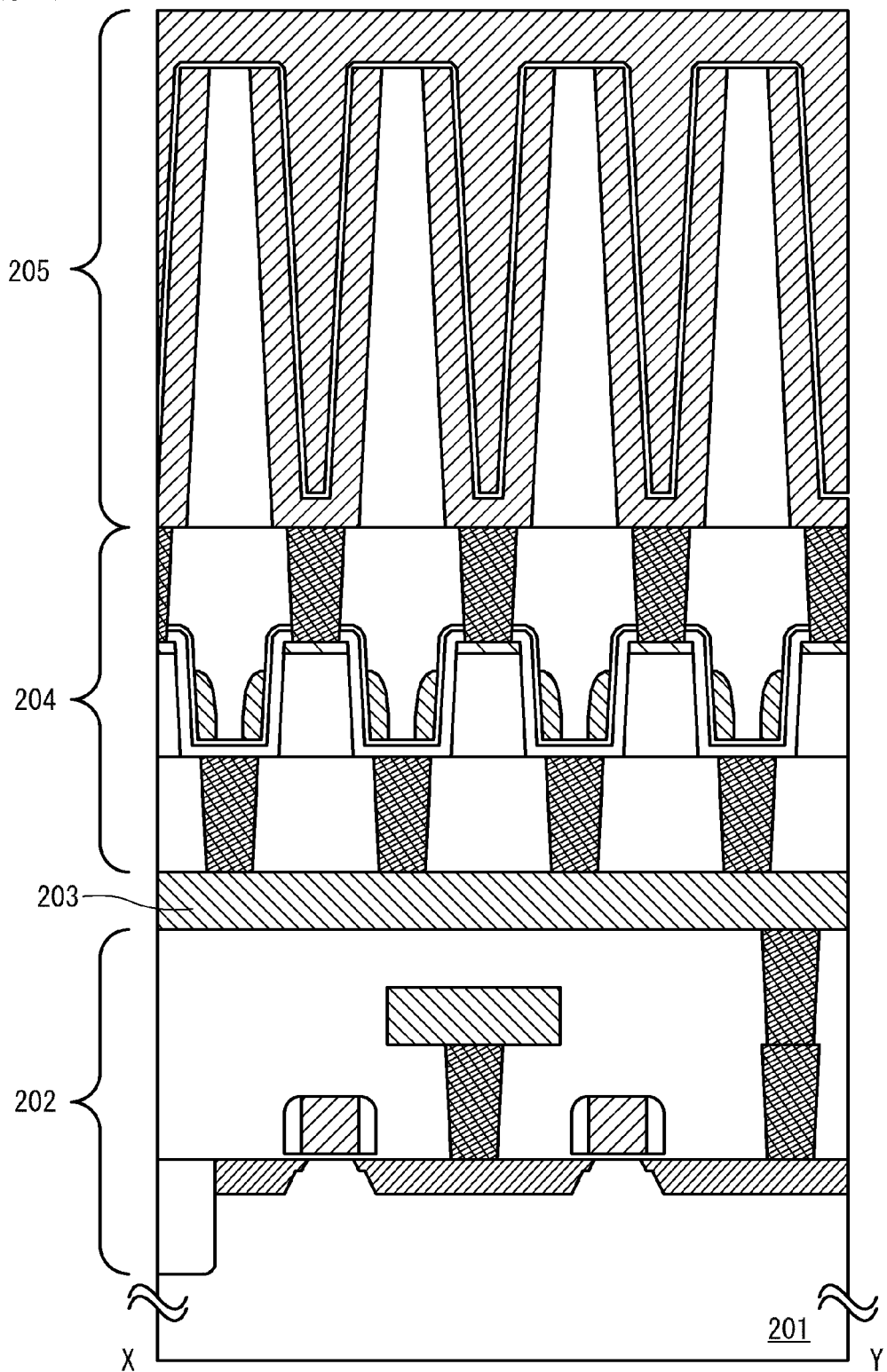
FIG. 8 illustrates an example of a structure of a semiconductor memory device according to an embodiment of the present invention.

The cell transistor illustrated in FIG. 8 can be manufactured by referring to Embodiment 1. In the drawing, the cell transistor is illustrated such that the area of a memory cell is $4F^2$. That is, the distance between the bottoms of the grooves (i.e., the distance between the center point of the bottom of one groove and the center point of the bottom of the next groove) is 2F.

For the arrangement of the memory cells which is illustrated, an open bit line structure is employed. Therefore, the semiconductor regions are formed into a stripe shape and each have ideally substantially the same length as the bit line, so that a plurality of transistors connected to the same bit line can be formed using one semiconductor region. In an actual case, however, when a second contact plug is formed, the semiconductor region may be divided.

The difference in arrangement of the memory cells between an open bit line structure and a folded bit line structure will be described with reference to FIGS. 9A and 9B. FIG. 9B is an example of arrangement of memory cells with the use of a folded bit line structure, which is similar to that illustrated in FIG. 5C. That is, island-shaped semiconductor regions are formed in a staggered pattern. A capacitor is formed over a second contact plug provided in each island-shaped semiconductor region. That is, each memory cell is formed such that the second contact plug is located at the center.

With such arrangement, when a pair of word lines are made active and electric charge of a capacitor of a memory cell connected to the pair of word lines is released to a first bit line, since there is no memory cell connected to the pair of word lines in the adjacent column, the potential of a bit line (a second bit line) in that column is not changed. Thus, by using the potential of the second bit line as a reference potential, the potential of the first bit line can be determined, so that data stored in the memory cell can be read out.

On the other hand, since the island-shaped semiconductor regions are arranged in a staggered pattern, the integration degree is reduced and the area of the memory cell is at least $8F^2$. This value is the same as a memory cell in a folded bit line structure using a planar cell transistor. However, since the area of one memory cell is large, a portion that can be used for the capacitor can be increased to make the capacitance of the capacitor large, which is an advantage.

Figure 9A:
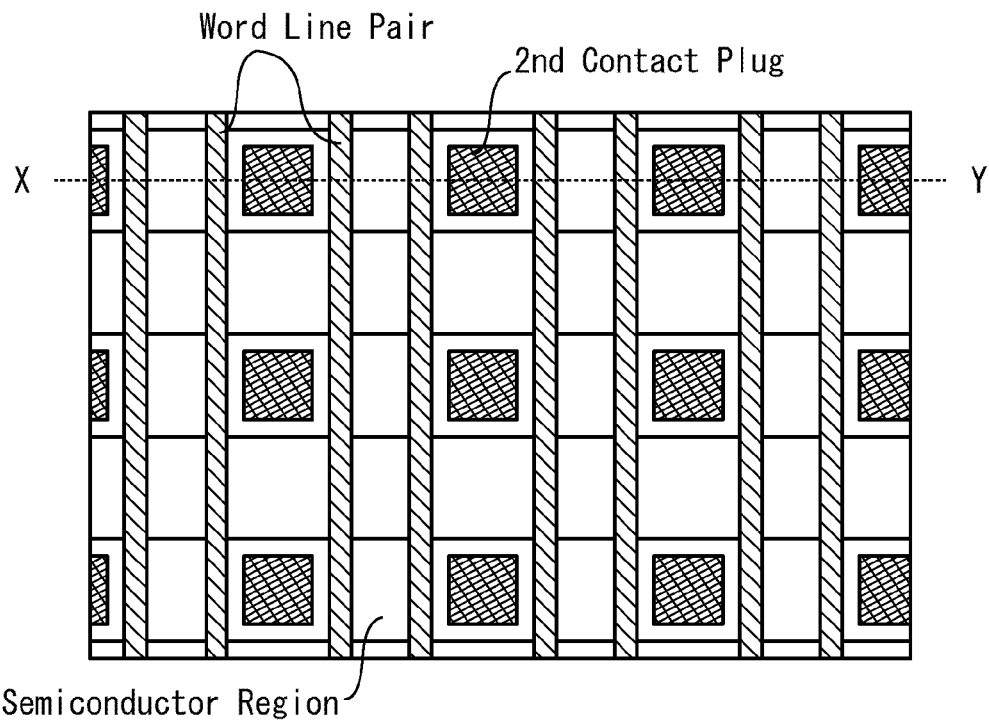
FIGS. 9A and 9B each illustrate an example of a structure of a semiconductor memory device according to an embodiment of the present invention.
Figure 9B:
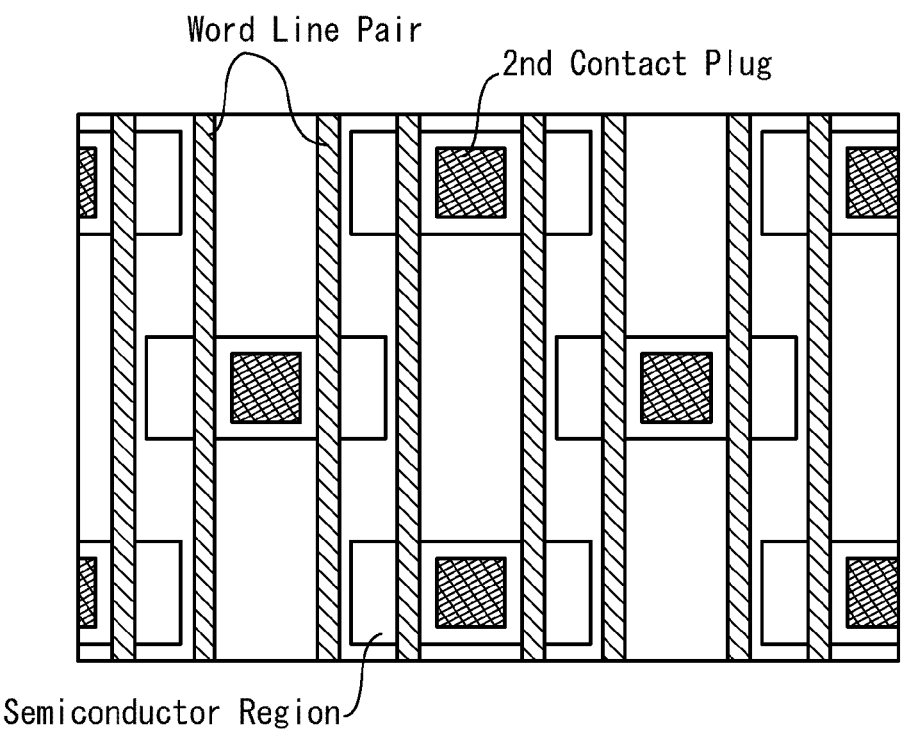

FIG. 9A illustrates an example of arrangement of memory cells which has an open bit line structure. A cross section along dotted line X-Y in FIG. 9A corresponds to FIG. 8. Semiconductor regions are arranged substantially parallel to the bit line in a stripe shape and a pair of word lines are provided so as to be substantially orthogonal to the semiconductor regions. A second contact plug is provided at the center of the pair of word lines, to which a capacitor is connected. As is clear from the drawing, the number of the memory cells is twice that of the folded bit line structure for the same area. Accordingly, the area of the memory cell is at least $4F^2$.

With the above arrangement, when a pair of word lines are made active and electric charge of a capacitor of a memory cell connected thereto is released to a first bit line, electric charge of a capacitor of a memory cell in the adjacent column is also released to a bit line in that column (a second bit line), so that the potential of the first bit line cannot be determined using the potential of the second bit line as a reference potential, unlike in a folded bit line structure. Therefore, a reference potential needs to be prepared separately.

This application is based on Japanese Patent Application serial no. 2011-024686 filed with Japan Patent Office on Feb. 8, 2011, the entire contents of which are hereby incorporated by reference.

What is claimed is:

1. A semiconductor memory device comprising:
a bit line over a substrate;
contact plugs over the bit line;
an insulator over the contact plugs;
a conductive layer over and in contact with a top surface of the insulator;
a semiconductor layer over and in direct contact with the conductive layer and the contact plugs;
a first word line and a second word line adjacent to side surfaces of the insulator with the semiconductor layer interposed therebetween; and
a capacitor electrically connected to the conductive layer,
wherein a thickness of each of the first word line and the second word line is greater than or equal to 40% and less than or equal to 80% of a sum of thicknesses of the insulator and the conductive layer.

2. The semiconductor memory device according to claim 1, wherein the semiconductor layer is electrically connected to the bit line.

3. The semiconductor memory device according to claim 1, wherein a thickness of the insulator is greater than or equal to twice and less than or equal to 20 times a width thereof.

4. The semiconductor memory device according to claim 1, further comprising a driver circuit below the bit line.

5. The semiconductor memory device according to claim 1, wherein the semiconductor layer is a material with a band gap of greater than or equal to 2.5 eV and less than or equal to 4 eV.

6. The semiconductor memory device according to claim 1, wherein the semiconductor layer comprises an oxide semiconductor.

7. The semiconductor memory device according to claim 1, wherein the same signal is applied to the first and second word lines.

8. A semiconductor device comprising:
a first conductive layer;
a first insulating layer over the first conductive layer;
contact plugs in the first insulating layer;
a second insulating layer over the contact plugs, and over and in direct contact with the first insulating layer;
a second conductive layer over and in contact with a top surface of the second insulating layer;
an oxide semiconductor layer over and in direct contact with the second conductive layer and the contact plugs;
a third insulating layer adjacent to the second insulating layer with the oxide semiconductor layer interposed therebetween;
a third conductive layer adjacent to a first side surface of the second insulating layer with the oxide semiconductor layer and the third insulating layer interposed therebetween; and
a fourth conductive layer adjacent to a second side surface of the second insulating layer with the oxide semiconductor layer and the third insulating layer interposed therebetween,
wherein the oxide semiconductor layer includes a channel formation region,
wherein the oxide semiconductor layer is electrically connected to the first conductive layer, and
wherein a thickness of each of the third conductive layer and the fourth conductive layer is greater than or equal to 40% and less than or equal to 80% of a sum of thicknesses of the second insulating layer and the second conductive layer.

9. The semiconductor device according to claim 8,
wherein the first conductive layer is a bit line, and
wherein each of the third conductive layer and the fourth conductive layer is a word line.

10. The semiconductor device according to claim 8, further comprising a capacitor,
wherein the capacitor is electrically connected to the second conductive layer.

11. A semiconductor device comprising:
a first conductive layer;
a first insulating layer over the first conductive layer;
contact plugs in the first insulating layer;
a second insulating layer over the contact plugs, and over and in direct contact with the first insulating layer;
a second conductive layer over and in contact with a top surface of the second insulating layer;
an oxide semiconductor layer over and in direct contact with the second conductive layer and the contact plugs;
a third insulating layer adjacent to the second insulating layer with the oxide semiconductor layer interposed therebetween; and
a third conductive layer adjacent to a side surface of the second insulating layer with the oxide semiconductor layer and the third insulating layer interposed therebetween,
wherein the oxide semiconductor layer includes a channel formation region,
wherein the oxide semiconductor layer is electrically connected to the first conductive layer, and
wherein a thickness of the third conductive layer is greater than or equal to 40% and less than or equal to 80% of a sum of thicknesses of the second insulating layer and the second conductive layer.

12. The semiconductor device according to claim 11,
wherein the first conductive layer is a bit line, and
wherein the third conductive layer is a word line.

13. The semiconductor device according to claim 11, further comprising a capacitor,
wherein the capacitor is electrically connected to the second conductive layer.

* * * * *